(12) United States Patent
Du

(10) Patent No.: US 7,948,756 B2
(45) Date of Patent: May 24, 2011

(54) HEAT DISSIPATION DEVICE

(75) Inventor: Juan Du, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 172 days.

(21) Appl. No.: 12/424,531

(22) Filed: Apr. 15, 2009

(65) Prior Publication Data
US 2010/0172103 A1    Jul. 8, 2010

(30) Foreign Application Priority Data
Jan. 5, 2009  (CN) .......................... 2009 1 0300054

(51) Int. Cl.
*H05K 7/20* (2006.01)
*H01L 23/34* (2006.01)
*F28F 7/00* (2006.01)
*A44B 11/25* (2006.01)

(52) U.S. Cl. ........ 361/700; 361/703; 361/709; 361/719; 257/719; 257/722; 174/16.3; 174/252; 165/80.4; 165/80.5; 165/104.33; 24/453; 24/458; 24/459; 24/520

(58) Field of Classification Search ............. 361/679.47, 361/679.52, 679.54, 697, 700, 704, 709, 361/710, 719; 257/718–719, 722; 174/16.3, 252; 165/80.3–80.5, 104.33, 185; 24/453, 458, 459, 520
See application file for complete search history.

(56) References Cited

U.S. PATENT DOCUMENTS

| | | | |
|---|---|---|---|
| 7,167,367 B2 * | 1/2007 | Zhang | 361/704 |
| 7,283,362 B2 * | 10/2007 | Lin et al. | 361/704 |
| 7,336,492 B2 * | 2/2008 | Yu | 361/710 |
| 7,385,823 B1 * | 6/2008 | Desrosiers et al. | 361/710 |
| 7,385,825 B2 * | 6/2008 | Xia et al. | 361/719 |
| 7,515,419 B2 * | 4/2009 | Li et al. | 361/704 |
| 2010/0108362 A1 * | 5/2010 | Du et al. | 174/252 |

* cited by examiner

*Primary Examiner* — Zachary M Pape
(74) *Attorney, Agent, or Firm* — Frank R. Niranjan

(57) ABSTRACT

A heat dissipation device includes a base, a connecting member and a wire-shaped clip. The base thermally contacts with an electronic component mounted on a printed circuit board. The connecting member encloses the base therein and is secured to a periphery of the base. A plurality of clasps extends upwardly from the connecting member. The clip is clasped by the clasps of the connecting member to be attached thereto. The clip is pressed downwardly to engage with a plurality of hooks of a bracket around the electronic component of the printed circuit board to make the base intimately contact with the electronic component.

13 Claims, 5 Drawing Sheets

HEAT DISSIPATION DEVICE

BACKGROUND

1. Technical Field

The present disclosure relates to heat dissipation devices, and particularly, to a heat sink of being conveniently assembled to and disassembled from an electronic component mounted a printed circuit board via a bracket, and a heat dissipation device having such a heat sink and a bracket.

2. Description of Related Art

A heat sink is usually placed in thermal contact with a heat generating electronic device, such as a central processing unit (CPU) which is mounted on a printed circuit board (PCB), and transfers heat through conduction away from the heat generating electronic device so as to prevent over-heating of the heat generating electronic device.

Conventionally, the heat sink and the PCB are assembled together by a number of screws. The screws may be assembled to and disassembled from the heat sink and the PCB one by one. This is very time-consuming and trouble. The PCB is prone to be destroyed through repeat assembly and disassembly of the heat sink.

What is needed, therefore, is a heat dissipation device overcoming the above-described problems.

DETAILED DESCRIPTION

Figure 1:
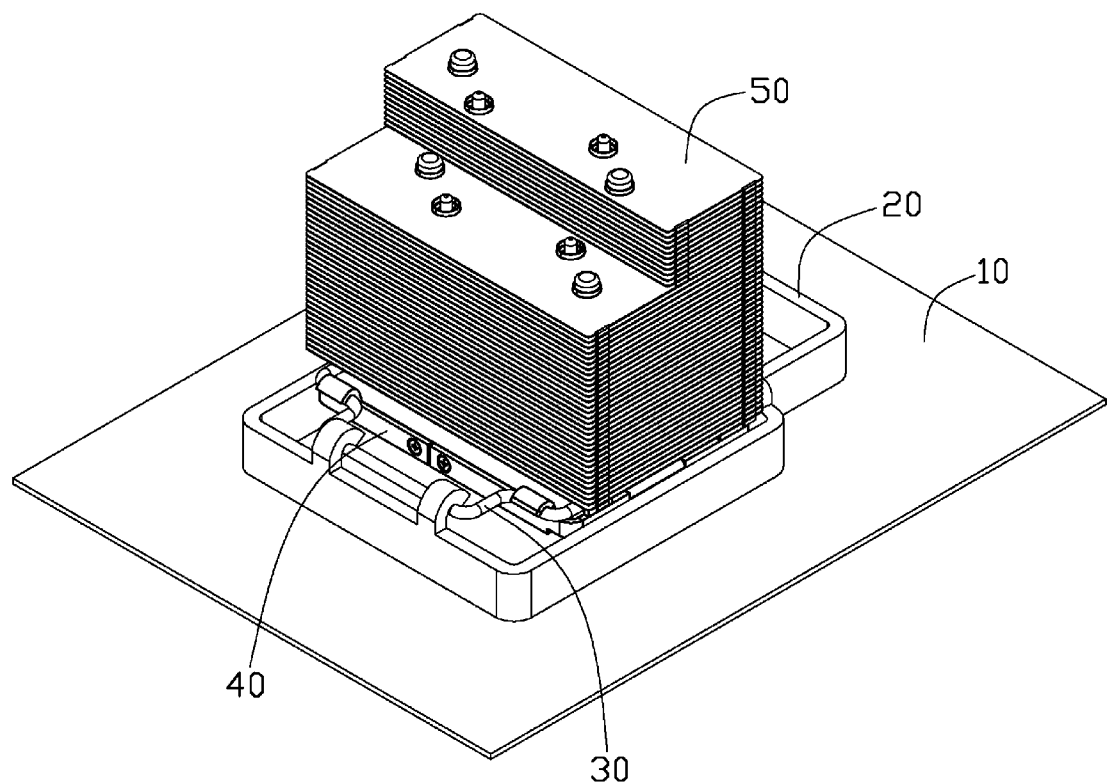
FIG. 1 is an assembled view of a heat dissipation device in accordance with an embodiment of the present disclosure, which is mounted on a printed circuit board.
Figure 2:
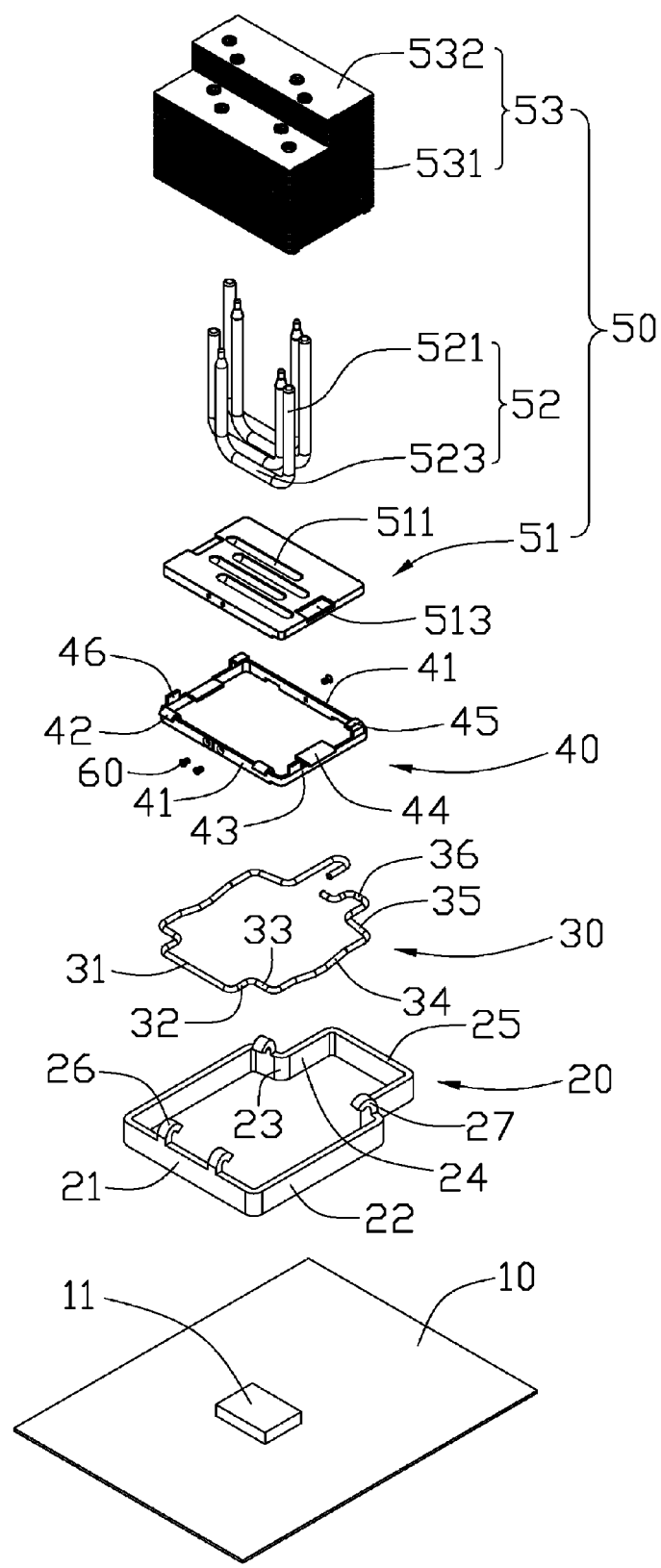
FIG. 2 is an exploded view of the heat dissipation device in FIG. 1.

Referring to FIGS. 1-2, a heat dissipation device of an embodiment is used to thermally contact an electronic component 11 of a printed circuit board 10 (PCB) to dissipate heat generated by the electronic component 11. The heat dissipation device comprises a heat sink 50, a connecting member 40 enclosing a bottom portion of the heat sink 50 therein, a bracket 20 mounted on the PCB 10 to enclose the electronic component 11 therein, and a wire clip 30 engaging with the connecting member 40 and the bracket 20 to elastically force the heat sink 50 to move downwardly whereby the heat sink 50 can have an intimate contact with the electronic component 11.

Figure 3:
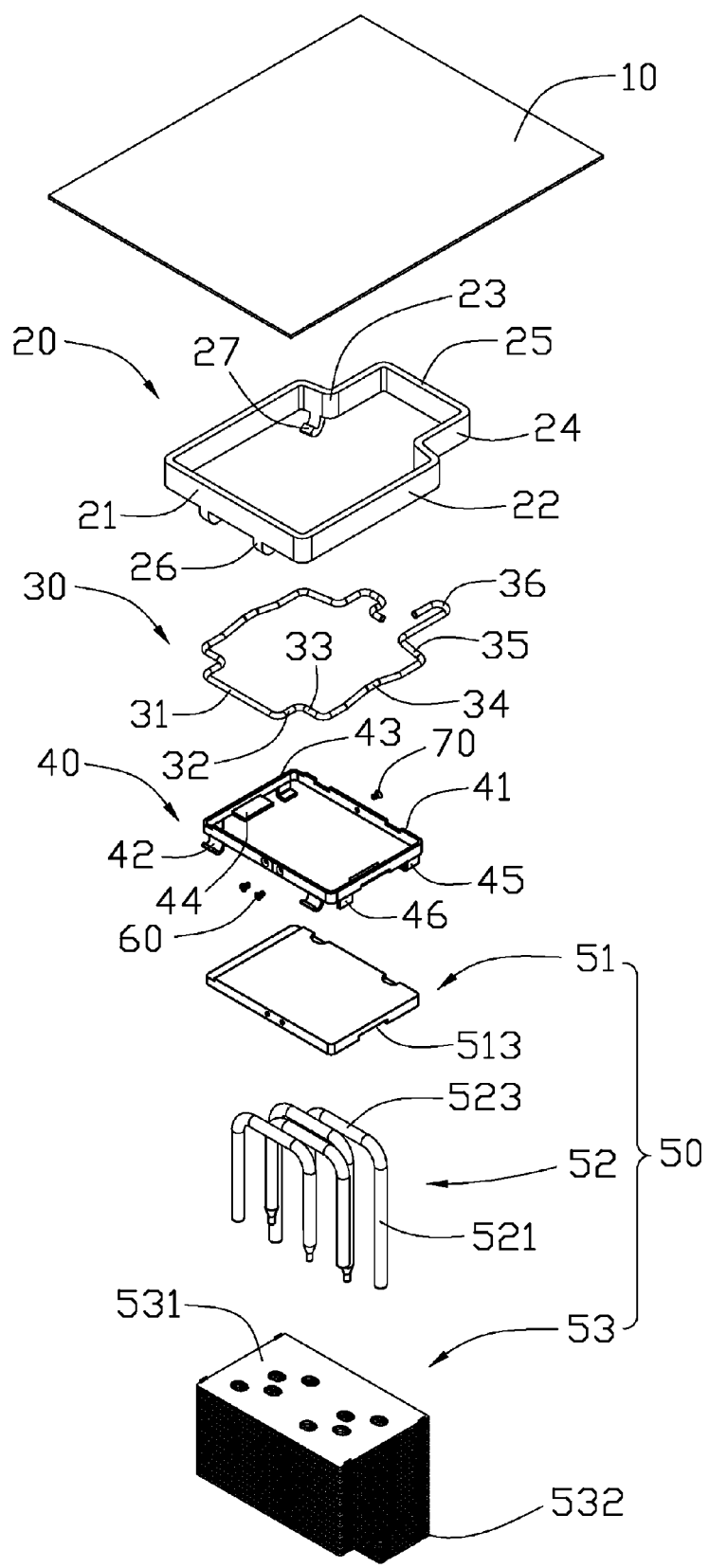
FIG. 3 is an inverted view of FIG. 2.

Referring to FIG. 3 also, the heat sink 50 comprises an elongated base 51, a fin group 53, and four U-shaped heat pipes 52. The fin group 53 is located at a top surface of the base 51. The heat pipes 52 extend through the fin group 53 and are secured on the top surface of the base 51.

The fin group 53 comprises a number of first fins 531 and a number of second fins 532. The first and second fins 531, 532 are substantially parallel to each other and engage with each other via locking members (not labeled) formed at corners thereof. Air passages are defined between the first and second fins 531, 532. Each of the first fins 531 and the second fins 532 is elongated sheet. A length of the second fin 532 is equal to that of the first fin 531. A width of the second fin 532 is smaller than that of the first fin 531. The second fins 532 are located at a rear side of a top of the first fins 531. Thus, the first fins 531 and the second fins 532 cooperatively form an L-shaped configuration.

Each of the heat pipes 52 comprises two parallel heat-conductive sections 521 and a connecting section 523 interconnecting with the two heat-conductive sections 521. Four heat-conductive sections 521 of two heat pipes 52 extend through the first and second fins 531, 532 from bottom to top. Another four heat-conductive sections 521 of the another two heat pipes 52 extend through the first fins 531 from bottom to top. The connecting sections 523 are located at a bottom end of the fin group 53. The connecting sections 523 are evaporators of the heat pips 52 for absorbing heat from the base 51 of the heat sink 50. The heat-conductive sections 521 are condensers of the heat pipes 52 for dissipating heat to the first and second fins 531, 532 of the heat sink 50.

The base 51 is made of aluminum or copper. The top surface of the base 51 defines four parallel grooves 511 to receive the connecting sections 523 of the heat pipes 52. The four grooves 511 have the same length. Ends of first and third grooves 511 are aligned with each other, and ends of second and fourth grooves 511 are aligned with each other, in which the first and third grooves 511 are located near a right end of the base 51 and the second and fourth grooves 511 are located near a left end of the base 51, as viewed from FIG. 2. Two recesses 513 are defined in central portions of the right and left ends of the base 51, respectively.

Figure 4:
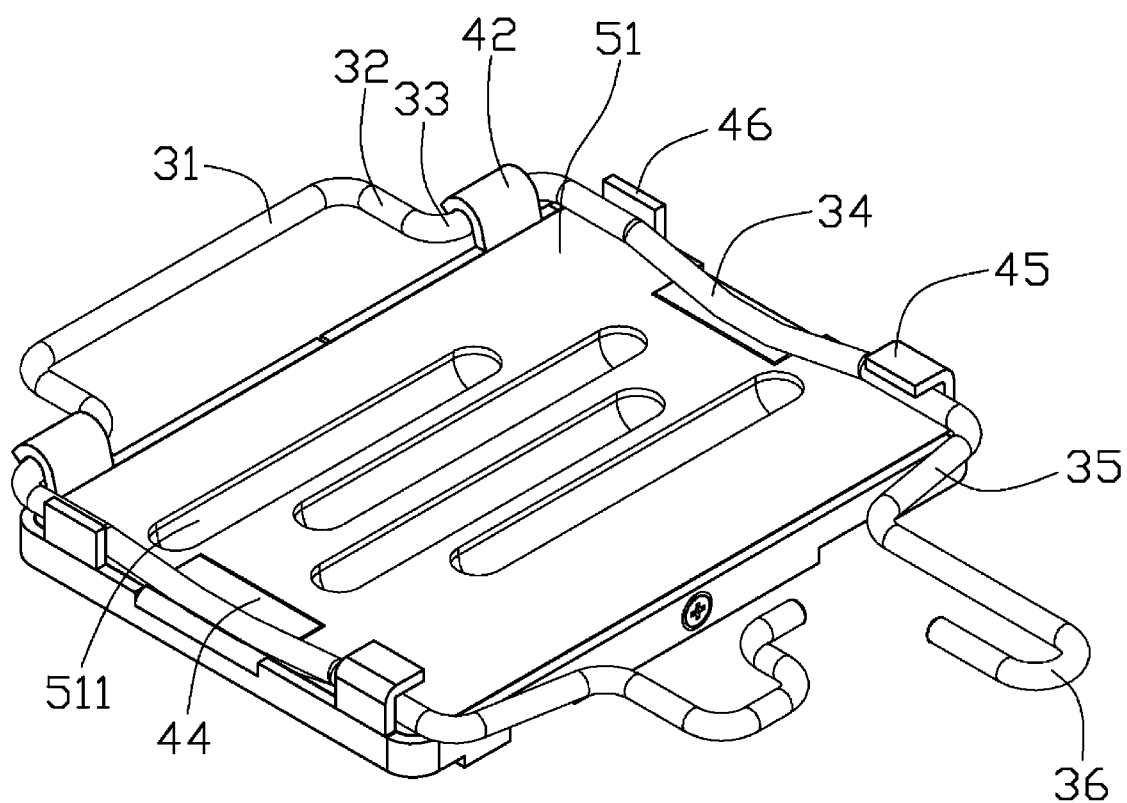
FIG. 4 is an assembled view of a base and a clip of the heat dissipation device in FIG. 1.
Figure 5:
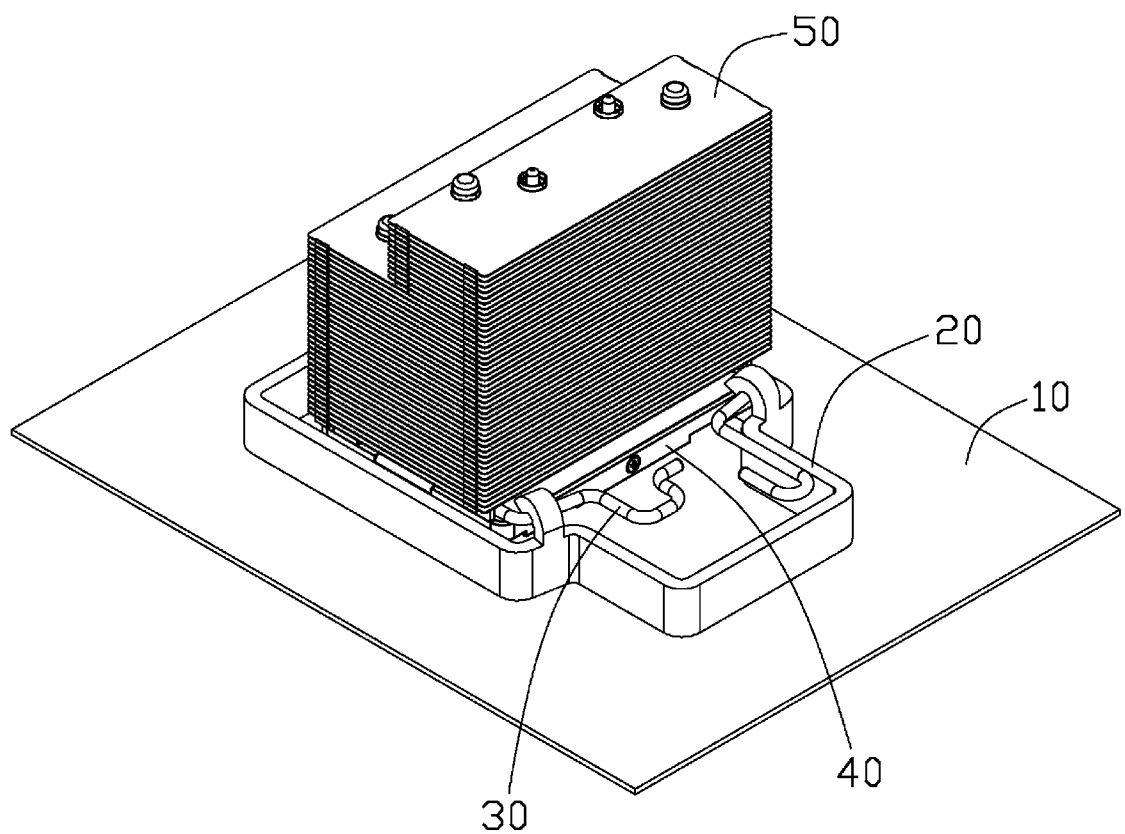
FIG. 5 is a view similar to FIG. 1, but shown from another aspect.

Referring to FIGS. 4-5 also, the connecting member 40 is a metal frame and comprises a pair of parallel first plates 41 and a pair of parallel second plates 43. The first plates 41 and second plates 43 interconnect with each other. Two inverted U-shaped first clasps 42 extend outwardly from opposite ends of a top of one of the first plates 41 to clasp the clip 30. Each of the second plates 43 comprises an engaging plate 44, an L-shaped second clasp 45 and a baffling plate 46. The baffling plate 46 and L-shaped second clasp 45 extend upwardly from opposite ends of a top of the second plate 43. The baffling plates 46 are located near the first clasps 42 of the first plate 41, respectively. The engaging plate 44 horizontally and perpendicularly extends from the top of the second plate 43 and is located between the second clasp 45 and the baffling plate 46. The engaging plate 44 and the second clasp 45 of one of the second plate 43 are oriented inwardly toward the other second plate 43. The base 51 is enclosed by the connecting member 40. A periphery of the base 51 intimately contacts with inner surfaces of the first and second plates 41, 43. The engaging plates 44 are received in the recesses 513 of the base 51, respectively. A plurality of the screws 60 extends through the first plates 41 and engages with the base 51.

The clip 30 is integrally made of a metal wire. The clip 30 comprises a straight first connecting portion 31, two straight extending portions 32, two straight second connecting portions 33, two bended pressing portions 34, two straight third connecting portions 35 and two operating portions 36. The first connecting portion 31, the extending portions 32, the second connecting portions 33, the pressing portions 34, the third connecting portions 35 and the operating portions 36 connect with each other in series.

The first connecting portion 31 engages with the bracket 20. The extending portions 32 perpendicularly extend from opposite ends of the first connecting portion 31. The first connecting portion 31 and the two extending portions 32 form a U-shaped configuration. The two second connecting portions 33 perpendicularly extend outwardly from two ends of the extending portions 32, respectively, and are oriented toward opposite directions. The two second connecting portions 33 are clasped by the two first clasps 42 of the connecting member 40. The two pressing portions 34 extend from free ends of the two second connecting portions 33 respectively. Central portions of the pressing portions 34 are extended downwardly, whereby the pressing portions 34 each have a V-shaped configuration. The central portion of the pressing portion 34 presses the engaging plate 44 of the connecting member 40. Opposite ends of each of the pressing portions 34 are respectively engaged with corresponding baffling plate 46 and second clasp 45. The two third connecting portions 35 extend inwardly from two free ends of the two pressing portions 34. The two third connecting portions 35 are oriented toward each other and engage with the bracket 20. A length of the third connecting portion 35 is equal to that of the second connecting portion 33. The two operating portions 36 are bended and extend from the two third connecting portions 35, respectively, with different lengths.

The bracket 20 is a metal frame and comprises a linking plate 21, two extending plates 22, two transition plates 23, two stretching plates 24 and a connecting plate 25. The two extending plates 22 perpendicularly extend from opposite ends of the linking plate 21, respectively. The linking plate 21 and the two extending plates 22 form a U-shaped configuration. A distance between inner surfaces of the two extending plates 22 is larger than a length of the first plate 41 of the connecting member 40. The two transition plates 23 extend inwardly and slantwise from ends of the two extending plates 22, respectively. The two stretching plates 24 extend rearwards from free ends of the two transition plates 23. The connecting plate 25 is perpendicularly connected between the rearmost ends of the two stretching plates 24. The linking plate 21 is parallel to the connecting plate 25. A length of the linking plate 21 is larger than that of the connecting plate 25. Two inverted U-shaped first hooks 26 extend upwardly and inwardly from a top of the linking plate 21. The two first hooks 26 are spaced from each other and oriented toward the connecting plate 25. The first connecting portion 31 of the clip 30 engages with the first hooks 26. Two inverted U-shaped second hooks 27 extend upwardly and inwardly from tops of the two transition plates 23, respectively. The second hooks 27 are oriented toward the linking plate 21. The second hooks 27 clasp the third connecting portions 35 of the clip 30.

In assembly, the bracket 20 is secured on the PCB 10 and surrounds the electronic component 11 of the PCB 10. The base 51 of the heat sink 50 is pressed in the connecting member 40 from bottom to top until the engaging plates 44 of the second plates 43 of the connecting member 40 are received in the recesses 513 of the base 51. The screws 60 extend through the first plates 41 and engage with the base 51 to assemble the base 51 and the connecting member 40 together. The first clasps 42 of the first plate 41 and the second clasps 45 and baffling plates 46 of the second plates 43 of the connecting member 40 are located above the top surface of the base 51. Top surfaces of the engaging plates 44 and the top surface of the base 50 are coplanar.

The operating portions 36 of the clip 30 are operated to enable the second connecting portions 33 of the clip 30 clasped by the first clasps 42 of the first plate 41 of the connecting member 40. The operating portions 36 are pressed inwardly to make the pressing portions 34 engage with the second clasps 45 and abut against the baffling plates 46 of the second plates 43 of the connecting member 40. The central portions of the pressing portions 34 press the engaging plates 44 of the connecting member 40. Thus, the clip 30 is assembled to the base 51 of the heat sink 50.

The heat-conductive sections 521 of the heat pipes 53 extend through the fin group 53 and are soldered thereto and the connecting sections 523 of the heat pipes 53 are received in the grooves 511 of the base 51 and soldered therein. Thus, the heat sink 50 is assembled.

The base 51 of the heat sink 50 is brought to be mounted on the electronic component 11, with the connecting member 40 and the base 51 of the heat sink 50 being enclosed by the bracket 20. The base 51 contacts with the electronic component 11 of the PCB 10, whereby heat generated by the electronic component 11 is absorbed by the base 11. The first connecting portion 31 of the clip 30 is clasped by the first hooks 26 of the bracket 20. The operating portions 36 of the clip 30 are pressed downwardly until the third connecting portions 35 of the clip 30 are located below the second hooks 27 of the bracket 20. The downward pressing force on the operating portions 36 is released and the second hooks 27 clasp the third connecting portions 35. Therefore, the heat dissipation device is assembled completely, and the base 51 of the heat sink 50 has an intimate engagement with the electronic component 11.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
   a base adapted for thermally contacting an electronic component mounted on a printed circuit board;
   a connecting member enclosing the base therein and engaging with a periphery of the base, the connecting member comprising:
   two opposite first plates and two opposite second plates interconnecting with each other to form a frame;
   two first clasps extending from one of the two first plates; and
   two second clasps extending from the two second plates, respectively; and
   a wire-shaped clip attached to the connecting member and engaging with the first and second clasps of the connecting member and adapted for engaging with a plurality of hooks of a bracket mounted on the printed circuit board and surrounding the electronic component of the printed circuit board to enable the base to have an intimate engagement with the electronic component.

2. The heat dissipation device as claimed in claim 1, wherein the two first clasps extend outwardly from two ends of a top of the one of the two first plates, and the two second clasps each extend from an end of a corresponding second plate remote from the one of the two first plates.

3. The heat dissipation device as claimed in claim 1, wherein two engaging plates extend inwardly from the two second plates and are oriented toward each other, and a top surface of the base defines two recesses for receiving the two engaging plates therein, respectively.

4. The heat dissipation device as claimed in claim 3, wherein the wire-shaped clip comprises a first connecting portion, two extending portions extending rearwards from opposite ends of the first connecting portion, two second connecting portions extending outwardly from free ends of the extending portions and oriented toward opposite directions, two pressing portions extending rearwards from free ends of the second connecting portions, and two third connecting portions extending inwardly from free ends of the pressing portions and oriented toward each other, the second connecting portions are clasped by the first clasps of the connecting member, the pressing portions press the engaging plates of the connecting member and are clasped by the second clasps of the connecting member, and the first and third connecting portions are adapted to be clasped by the hooks of the bracket.

5. The heat dissipation device as claimed in claim 4, wherein two baffling plates extend upwardly from the two second plates respectively and are located near the first clasps, respectively, and the two baffling plates abut against the pressing portions of the wire-shaped clip.

6. The heat dissipation device as claimed in claim 5, wherein central portions of the pressing portions of the wire-shaped clip extend downwardly to abut against the engaging plates of the connecting member, and opposite ends of each of the pressing portions abut against a corresponding second clasp and a corresponding baffling plate, respectively.

7. The heat dissipation device as claimed in claim 4, wherein a fin group is located at a top of the base, and a heat pipe extends through the fin group and is secured on the base.

8. The heat dissipation device as claimed in claim 4, wherein the wire-shaped clip further comprises two operation portions extending inwardly from free ends of the third connecting portions, respectively.

9. An electronic assembly comprising:
a printed circuit board;
an electronic component mounted on the printed circuit board;
a bracket mounted on the printed circuit board and surrounding the electronic component;
a heat sink comprising a base mounted on the electronic component;
a connecting member secured to a periphery of the base of the heat sink, the connecting member comprising:
two opposite first plates and two opposite second plates interconnecting with each other to form a frame;
two first clasps extending from one of the two first plates; and
two second clasps extending from the two second plates, respectively; and
a wire clip attached to the connecting member and having at least a portion being pressed downwardly to engage with the bracket thereby forcing the base of the heat sink to move downwardly to have an intimate engagement with the electronic component.

10. The electronic assembly as claimed in claim 9, wherein the heat sink further comprises a plurality of fins located over the base and at least a heat pipe connecting the base with the fins.

11. The electronic assembly as claimed in claim 10, wherein the bracket forms a plurality of hooks thereon, the hooks are oriented toward each other, and the at least a portion of the wire clip is pressed downwardly to engage with at least one of the hooks.

12. The electronic assembly as claimed in claim 9, wherein the connecting member further comprises a pair of engaging plates extending inwardly from the two second plates toward each other and received in opposite ends of a top of the base.

13. The electronic assembly as claimed in claim 12, wherein the wire clip has two spaced V-shaped pressing portions pressing downwardly on the engaging plates of the connecting member.

* * * * *